(12) United States Patent
Chang et al.

(10) Patent No.: US 11,501,845 B2
(45) Date of Patent: Nov. 15, 2022

(54) DATA ACCESS SYSTEM, AND METHOD FOR OPERATING A DATA ACCESS SYSTEM

(71) Applicant: Realtek Semiconductor Corp., HsinChu (TW)

(72) Inventors: Chia-Jung Chang, HsinChu (TW); Chiu-Yun Tsai, HsinChu (TW); Fu-Ching Hsu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 5 days.

(21) Appl. No.: 17/338,702

(22) Filed: Jun. 4, 2021

(65) Prior Publication Data

US 2021/0383889 A1    Dec. 9, 2021

(30) Foreign Application Priority Data

Jun. 8, 2020 (TW) ................................ 109119182

(51) Int. Cl.
| | | |
|---|---|---|
| *G11C 29/42* | (2006.01) | |
| *G11C 11/4093* | (2006.01) | |
| *G11C 29/36* | (2006.01) | |
| *G11C 29/44* | (2006.01) | |

(52) U.S. Cl.
CPC .......... *G11C 29/42* (2013.01); *G11C 11/4093* (2013.01); *G11C 29/36* (2013.01); *G11C 29/4401* (2013.01)

(58) Field of Classification Search
CPC ..... G11C 29/42; G11C 11/4093; G11C 29/36; G11C 29/4401
See application file for complete search history.

(56) References Cited

U.S. PATENT DOCUMENTS

| | | | | |
|---|---|---|---|---|
| 2009/0210772 | A1* | 8/2009 | Noguchi | G11C 16/3427 714/764 |
| 2015/0242352 | A1* | 8/2015 | Jang | G06F 13/4273 710/310 |
| 2021/0311826 | A1* | 10/2021 | Senoo | G06F 13/1668 |
| 2021/0383889 | A1* | 12/2021 | Chang | G06F 11/1048 |

\* cited by examiner

*Primary Examiner* — Tuan T Nguyen
(74) *Attorney, Agent, or Firm* — Winston Hsu

(57) ABSTRACT

A data access system includes a flash memory, a first inversion circuit, a block buffer memory, an error checking and correcting circuit, a second inversion circuit, and an application circuit. The first inversion circuit inverts a plurality of pieces of data stored in a block of the flash memory to generate a plurality of pieces of inverted data. The block buffer memory stores the plurality of pieces of inverted data. When the ECC circuit determines that the plurality of pieces of inverted data are correctable, the ECC circuit corrects at least one piece of inverted data stored in the block buffer memory. The second inversion circuit inverts the plurality of pieces of inverted data stored in the block buffer memory to generate a plurality of pieces of recovered data. The application circuit receives the plurality of pieces of recovered data and performs a corresponding operation accordingly.

18 Claims, 3 Drawing Sheets

DATA ACCESS SYSTEM, AND METHOD FOR OPERATING A DATA ACCESS SYSTEM

CROSS REFERENCE TO RELATED APPLICATION

This non-provisional application claims priority of Taiwan patent application No. 109119182, filed on 8 Jun. 2020, included herein by reference in its entirety.

BACKGROUND OF THE INVENTION

1. Field of the Invention

The invention relates to a data storage system, and in particular, to a data access system capable of simplifying a data access process.

2. Description of the Prior Art

Flash memories are widely used in many systems owing to the properties of non-volatility and re-programmability. In general, data may only be written into blocks of flash memories that have not been written. Therefore, prior to writing into the flash memory, it is necessary to determine whether the block has been written; and if data has been written into the block, the block must be erased first, only then new data may be written into the block. In addition, due to a high error rate of flash memory, prior to writing into the flash memory, an error correction (error checking and correcting, ECC) circuit is employed to determine whether the block is a bad block. If there are too many errors in a block, the error checking and correcting circuit will determine that the block is an unusable bad block. In order to ensure the accuracy of data, the system will continue to look for good blocks in the flash memory to store the data.

In the prior art, since the error checking and correcting circuit often falsely determines that an unwritten block is a bad block, complicated circuits are often incorporated to perform further determinations for identifying the unwritten block, resulting in a complicated process of accessing the flash memory.

SUMMARY OF THE INVENTION

According to an embodiment of the invention, a data access system includes a flash memory, a first inversion circuit, a block buffer memory, an error checking and correcting (ECC) circuit, a second inversion circuit and an application circuit. The flash memory includes a plurality of blocks, a first inversion circuit coupled to the flash memory, and is used to receive a plurality of pieces of data stored in a block of the plurality of blocks, and invert the plurality of pieces of data to generate a plurality of pieces of inverted data. The block buffer memory is coupled to the first inversion circuit and is used to store the plurality of pieces of inverted data. The ECC circuit is coupled to the first inversion circuit and the block buffer memory, and is used to determine whether the plurality of pieces of inverted data are repairable, and if so, correct at least one piece of inverted data stored in the block buffer memory. The second inversion circuit is coupled to the block buffer memory and is used to receive the plurality of pieces of inverted data from the block buffer memory, and invert the plurality of pieces of inverted data to generate a plurality of pieces of recovered data. The application circuit is used to receive the plurality of pieces of recovered data, and perform a corresponding operation according to the plurality of pieces of recovered data.

According to an embodiment of the invention, a data access system includes a flash memory, a block buffer memory, an error checking and correcting circuit and an application circuit. The flash memory comprises a plurality of blocks. A method of operating the data access system comprises the flash memory outputting a plurality of pieces of data stored in a block of the plurality of blocks; inverting the plurality of pieces of data to generate a plurality of pieces of inverted data; the block buffer memory storing the plurality of pieces of inverted data; when the error checking and correcting circuit determines that the plurality of pieces of inverted data are repairable, the error checking and correcting circuit correcting at least one piece of the plurality of pieces of inverted data stored in the block buffer memory; inverting the plurality of pieces of inverted data to generate the plurality of pieces of recovered data; and the application circuit receiving a plurality of pieces of recovered data to perform a corresponding operation accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
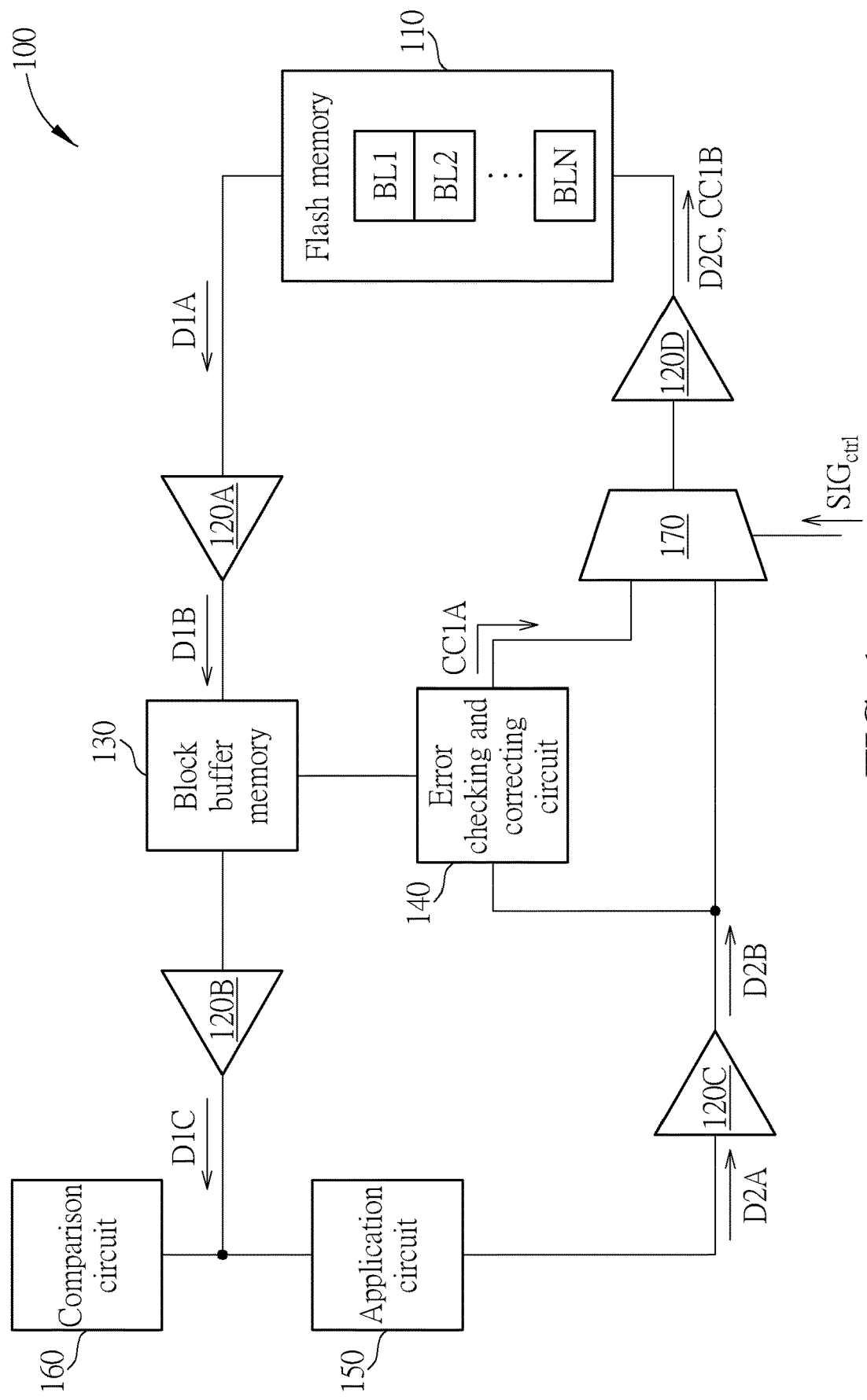
FIG. 1 is a schematic diagram of a data access system according to an embodiment of the invention.

FIG. 1 is a schematic diagram of a data access system 100 according to an embodiment of the invention. The data access system 100 includes a flash memory 110, a first inversion circuit 120A, a second inversion circuit 120B, a block buffer memory 130, an error checking and correcting (ECC) circuit 140 and an application circuit 150.

The first inversion circuit 120A may be coupled to the flash memory 110. The block buffer memory 130 may be coupled to the first inversion circuit 120A and the second inversion circuit 120B. The error checking and correcting circuit 140 may be coupled to the block buffer memory 130. The application circuit 150 may be coupled to the second inversion circuit 120B.

In some embodiments, the application circuit 150 may access data in the flash memory 110 to perform required operations. For example, the application circuit 150 may be, but is not limited thereto, a double data rate (DDR) memory that provides data upon request of the processor. In addition, the flash memory 110 may be, but is not limited to, a NAND flash memory, and may include a plurality of blocks BL1 to BLN, where N is a positive integer. Prior to performing data access to the block BL1 of the flash memory 110, the application circuit 150 is required to determine whether the block BL1 is a good block via the error checking and correcting circuit 140. If the block BL1 is a bad block, the block BL1 may not be able to store data correctly, and application circuit 150 will select another block for data access.

In general, the error checking and correcting circuit 140 may only be capable of correcting a fixed number of bits. For example, in some embodiments, the error checking and correcting circuit 140 may correct up to 6 error bits, e.g., from 1 to 0. In such a case, when the number of error bits exceeds 6, the error checking and correcting circuit 140 will report that the error is unrepairable. However, in some embodiments, prior to writing data into the blocks BL1 to BLN of the flash memory 110, the blocks BL1 to BLN are preset by a first value, e.g., 1, and if data access is perform on the block BL1 directly, the error checking and correcting circuit 140 will determine that the block BL1 is a bad block owing to the number of one-bits being too large. In such a case, it is necessary to count the number of one-bits in the block BL1 for the system to determine whether the block BL1 is indeed a bad block or an unwritten empty block. In the prior art, since the circuit for counting is relatively complicated, the overall circuit area will be unnecessarily enlarged.

In order to simplify the operation of the system, the data access system 100 may invert the data read from the block by the first inversion circuit 120A, so as to prevent the error checking and correcting circuit 140 from false determination. For example, if the application circuit 150 is configured to access the data of the block BL1, the first inversion circuit 120A will first invert the bits of a plurality of pieces of first data D1A in the block BL1 to generate a plurality of pieces of first inverted data D1B and store the plurality of pieces of first inverted data D1B in the block buffer memory 130.

Next, the error checking and correcting circuit 140 may determine whether the plurality of pieces of first inverted data D1B may be repairable, and when the error checking and correcting circuit 140 determines that the plurality of pieces of first inverted data D1B have an error but is repairable, the error checking and correcting circuit 140 may correct at least one piece of the plurality of pieces of first inverted data D1B.

In such a case, if the block BL1 has not been written, the bits of the first data D1A will be 1, and the bits of the first inverted data D1B will all be 0. Therefore, even if the block BL1 is an empty block, the error checking and correcting circuit 140 will not falsely determine that the block BL1 is a bad block as a result of too many one-bits in the data.

After the error checking and correcting circuit 140 completes error detection and/or correction, the second inversion circuit 120B may receive the plurality of pieces of first inverted data D1B from the block buffer memory 130, and invert the plurality of pieces of first inverted data D1B to generate a plurality of pieces of first recovered data D1C. In this manner, the application circuit 150 may receive the plurality of pieces of recovered data D1C, and perform a corresponding operation according to the plurality of pieces of recovered data D1C.

The data access system 100 may invert the plurality of pieces of first data MA by the first inversion circuit 120A to generate the plurality of pieces of first inverted data D1B, ensuring a proper operation of the error checking and correcting circuit 140 without falsely determining a good block as a bad block. In addition, in FIG. 1, the data access system 100 may further include a comparison circuit 160. The comparison circuit 160 may be coupled to the second inversion circuit 120B, and may determine whether all pieces of the first recovered data D1C have the first value, e.g., 1. In this manner, the comparison circuit 160 may determine whether the block BL1 has not been written.

In the data access system 100, the comparison circuit 160 detects whether all pieces of recovered data D1C from the block buffer memory 130 are 1 to facilitate the system to determine whether the block BL1 is an empty block without falsely determining that the empty (not yet written) good block is a bad block, and without the need of counting the number of bits being 1. Therefore, compared to the counting circuit adopted in the prior art, the circuit structure adopting the comparison circuit 160 is simpler, and the required circuit area is also smaller.

In some embodiments, prior to the application circuit 150 writing data into the flash memory 110, the error checking and correcting circuit 140 generates a corresponding piece of check code according to each piece of data, so as to perform error detection and correction upon reading each subsequent piece of data.

In FIG. 1, the data access system 100 may further include a third inversion circuit 120C, a fourth inversion circuit 120D and a multiplexer 170. The third inversion circuit 120C may be coupled to the application circuit 150 and the error checking and correcting circuit 140. The third inversion circuit 120C may invert a plurality of pieces of second data D2A from the application circuit 150 to generate a plurality of pieces of second inverted data D2B. The error checking and correcting circuit 140 may generate a plurality of pieces of error check code CC1A according to the second inverted data D2B. As a result, in the subsequent operation, when the application circuit 150 is configured to read the second data D2A from the flash memory 110, after the first inverter 120A inverts the plurality of pieces of second data D2A, the error checking and correcting circuit 140 may determine whether the inverted data is repairable according to the error check code CC1A generated according to the plurality of pieces of second inverted data D2B, so as to ensure that the error checking and correcting circuit 140 can operate properly.

The multiplexer 170 may be coupled to the third inversion circuit 120C, the error checking and correcting circuit 140, and the fourth inversion circuit 120D. The multiplexer 170 may select a data transmission path according to the control signal $SIG_{ctrl}$ to respectively transmit the second inverted data D2B from the third inversion circuit 120C or the error check code CC1A to the fourth inversion circuit 120D. In this manner, the fourth inversion circuit 120D may invert the plurality of pieces of second inverted data D2B to generate the plurality of pieces of second recovered data D2C, and invert the plurality of pieces of error check code CC1A generated by the error checking and correcting circuit 140 to generate a plurality of pieces of inverted error check code CC1B. Then, the second recovered data D2C and the corresponding invert error check code CC1B may be stored in a designated block in the flash memory 110, e.g., the block BL2.

The data access system 100 may invert the data by the inversion circuits, preventing the error checking and correcting circuit 140 from falsely determining that the empty block including all one-bits is a bad block, simplifying the data access process, simplifying the circuit structure of the comparison circuit 160 for determining an empty block, and shrinking the circuit area of the data access system 100.

Figure 2:
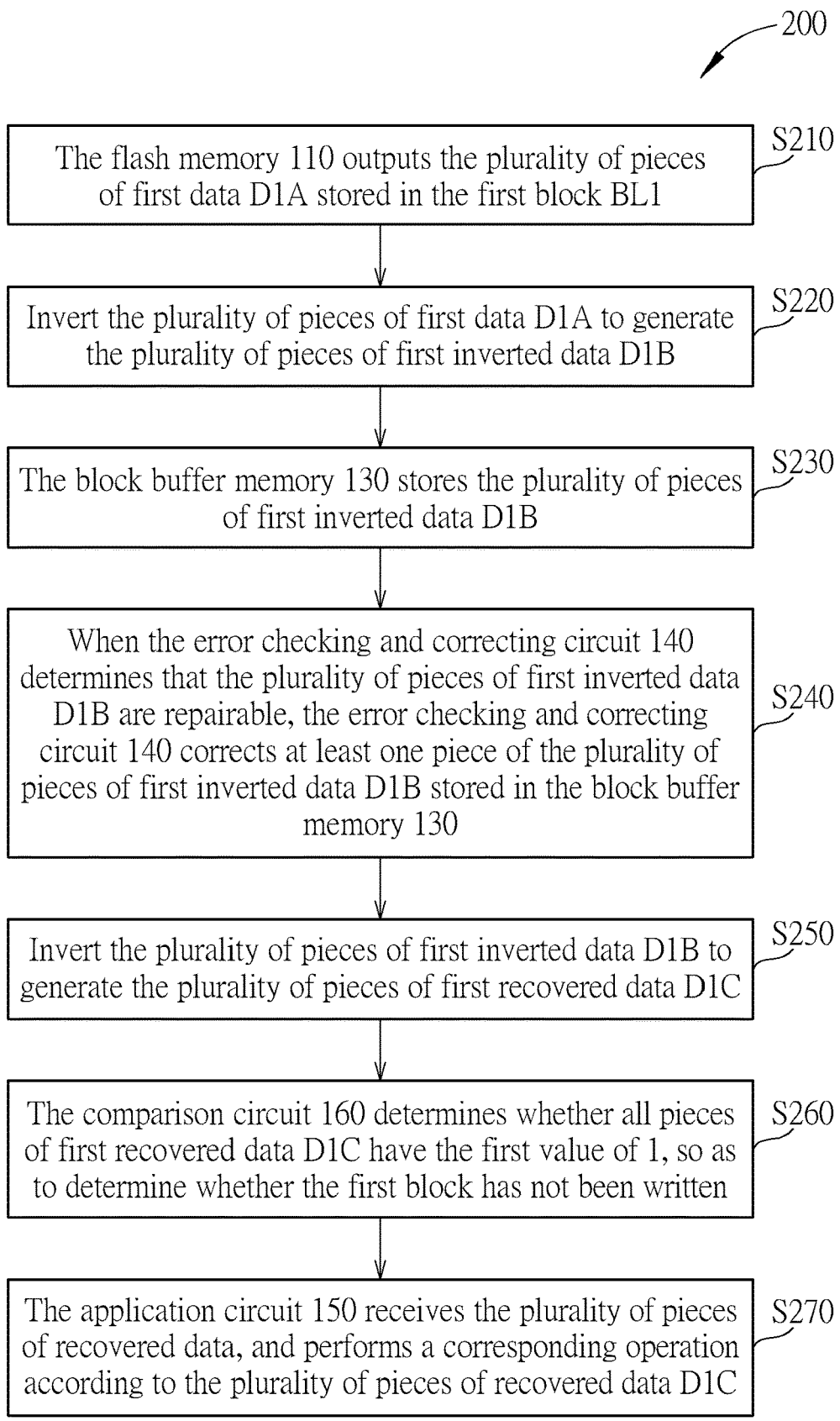
FIG. 2 is a flowchart of a method of operating the data access system in FIG. 1.

FIG. 2 is a flowchart of a method 200 of operating the data access system 100. The method 200 includes Step S210 to S270, S210: The flash memory 110 outputs the plurality of pieces of first data D1A stored in the first block BL1;

S220: Invert the plurality of pieces of first data D1A to generate the plurality of pieces of first inverted data D1B;

S230: The block buffer memory 130 stores the plurality of pieces of first inverted data D1B;

S240: When the error checking and correcting circuit 140 determines that the plurality of pieces of first inverted data D1B are repairable, the error checking and correcting circuit 140 corrects at least one piece of the plurality of pieces of first inverted data D1B stored in the block buffer memory 130;

S250: Invert the plurality of pieces of first inverted data D1B to generate the plurality of pieces of first recovered data D1C;

S260: The comparison circuit 160 determines whether all pieces of first recovered data D1C have the first value of 1, so as to determine whether the first block has not been written;

S270: The application circuit 150 receives the plurality of pieces of recovered data, and performs a corresponding operation according to the plurality of pieces of recovered data D1C.

Figure 3:
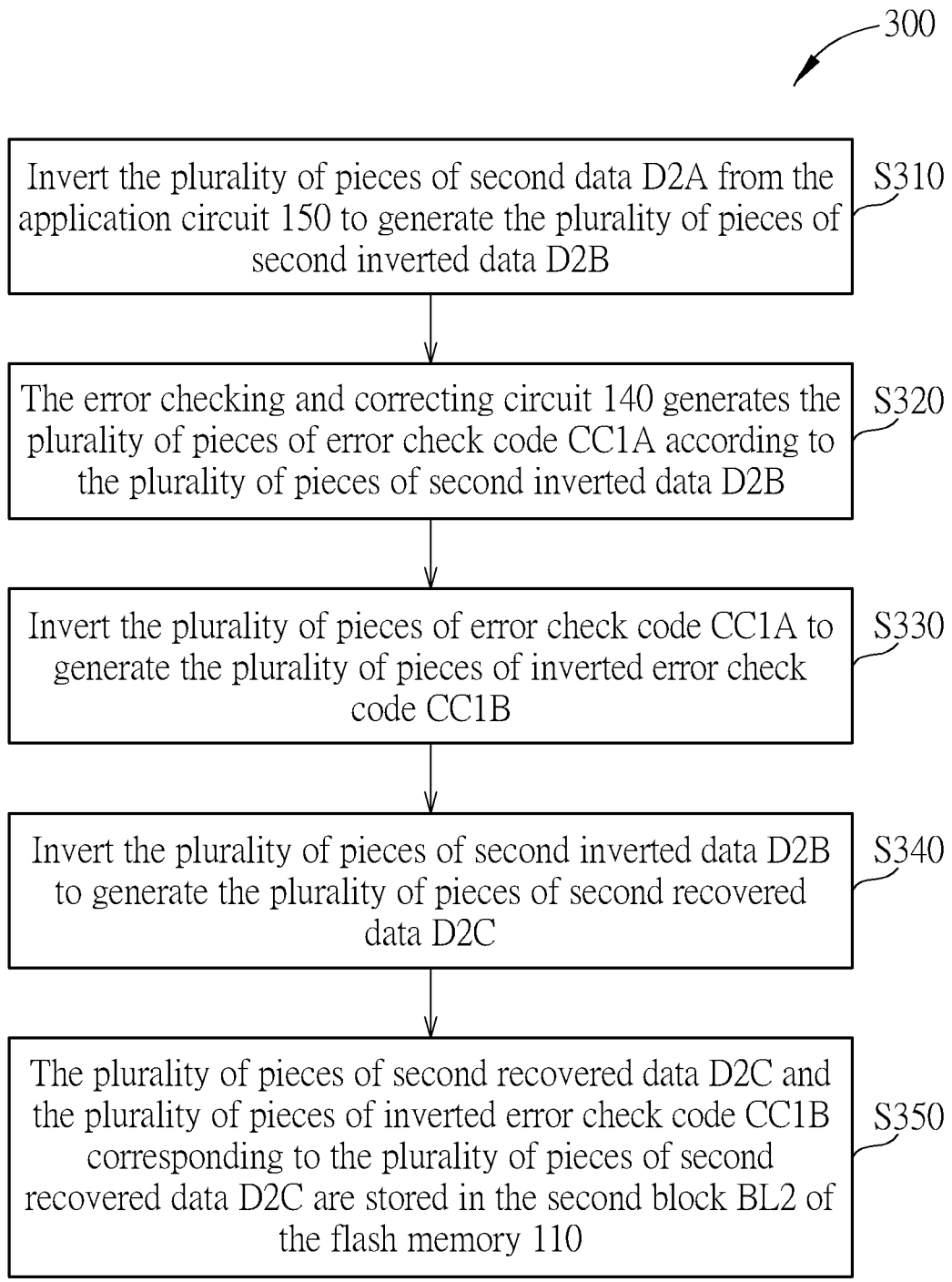
FIG. 3 is a flowchart of another method of operating the data access system in FIG. 1.

The method 200 may employ Steps S210 to S270 to first invert the first data D1A from the block BL1 of the flash memory 110, preventing the error checking and correcting circuit 140 from falsely determining that an empty block containing all one-bits is a bad block, and simplifying the data access process. In addition, in order to ensure that the error checking and correcting circuit 140 may correctly detect and correct bit errors, the method 200 may also include other steps to ensure that the corresponding error check code is stored along with the data in the flash memory 110. FIG. 3 is a flowchart of another exemplary method 300 of operating the data access system 100. In FIG. 3, the method 300 may include Steps S310 to S350.

S310: Invert the plurality of pieces of second data D2A from the application circuit 150 to generate the plurality of pieces of second inverted data D2B;

S320: The error checking and correcting circuit 140 generates the plurality of pieces of error check code CC1A according to the plurality of pieces of second inverted data D2B;

S330: Invert the plurality of pieces of error check code CC1A to generate the plurality of pieces of inverted error check code CC1B;

S340: Invert the plurality of pieces of second inverted data D2B to generate the plurality of pieces of second recovered data D2C;

S350: The plurality of pieces of second recovered data D2C and the plurality of pieces of inverted error check code CC1B corresponding to the plurality of pieces of second recovered data D2C are stored in the second block BL2 of the flash memory 110.

In this manner, prior to the application circuit 150 writing the data into the flash memory 110, the error checking and correcting circuit 140 may generate a corresponding piece of error check code according to the second inverted data D2B, so as to perform an error detection and correction on the inverted data of the second recovered data D2C upon reading the second recovered data D2C.

The data access system and the method of operating the data access system according to the embodiments of the present invention may invert the data from the flash memory by the inversion circuits, preventing the error checking and correcting circuit from falsely determining that the unwritten empty block is a bad block, simplifying the data access process, employing the comparison circuit 160 for determining an empty block to simplify the circuit structure, and shrinking the circuit area of the data access system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data access system comprising:
a flash memory comprising a plurality of blocks;
a first inversion circuit coupled to the flash memory and configured to receive a plurality of pieces of first data stored in a first block of the plurality of blocks, and invert the plurality of pieces of first data to generate a plurality of pieces of first inverted data;
a block buffer memory coupled to the first inversion circuit and configured to store the plurality of pieces of first inverted data;
an error checking and correcting (ECC) circuit coupled to the first inversion circuit and the block buffer memory, and configured to determine whether the plurality of pieces of first inverted data are repairable, and if so, correct at least one piece of first inverted data stored in the block buffer memory;
a second inversion circuit coupled to the block buffer memory and configured to receive the plurality of pieces of first inverted data from the block buffer memory, and invert the plurality of pieces of first inverted data to generate a plurality of pieces of first recovered data; and
an application circuit configured to receive the plurality of pieces of first recovered data, and perform a corresponding operation according to the plurality of pieces of first recovered data.

2. The data access system of claim 1, wherein if the first block has not been written, the plurality of pieces of first data in the first block have a first value.

3. The data access system of claim 2, further comprising a comparison circuit coupled to the second inversion circuit and configured to determine whether all pieces of first recovered data have the first value, so as to determine whether the first block has not been written.

4. The data access system of claim 1, wherein the application circuit is a double data rate (DDR) memory.

5. The data access system of claim 1, further comprising a third inversion circuit coupled to the application circuit and configured to invert a plurality of pieces of second data transmitted from the application circuit to generate a plurality of pieces of second inverted data.

6. The data access system of claim 5, wherein the error checking and correcting circuit is further coupled to a third inversion circuit and configured to generate a plurality of pieces of error check code based on the plurality of pieces of second inverted data.

7. The data access system of claim 6, further comprising a fourth inversion circuit coupled to the flash memory, and configured to invert the plurality of pieces of error check code to generate a plurality of pieces of inverted error check code.

8. The data access system of claim 7, further comprising a multiplexer coupled to the third inversion circuit, the error checking and correcting circuit and the fourth inversion circuit, and configured to transmit the plurality of pieces of second inverted data from the third inversion circuit or the plurality of pieces of error check code to the fourth inversion circuit according to a control signal.

9. The data access system of claim 8, wherein the fourth inversion circuit is further configured to invert the plurality of pieces of second inverted data to generate a plurality of pieces of second recovered data, and store in the flash memory the plurality of pieces of second recovered data and the plurality of pieces of inverted error check code corresponding to the plurality of pieces of second recovered data.

10. The data access system of claim 1, wherein the flash memory is a NAND flash memory.

11. A method of operating a data access system, the data access system comprising a flash memory, a block buffer memory, an error checking and correcting (ECC) circuit and an application circuit, the flash memory comprising a plurality of blocks, the method comprising:
the flash memory outputting a plurality of pieces of first data stored in a first block of the plurality of blocks;
inverting the plurality of pieces of first data to generate a plurality of pieces of first inverted data;
the block buffer memory storing the plurality of pieces of first inverted data;
when the error checking and correcting circuit determines that the plurality of pieces of first inverted data are repairable, the error checking and correcting circuit correcting at least one piece of the plurality of pieces of first inverted data stored in the block buffer memory;
inverting the plurality of pieces of first inverted data to generate the plurality of pieces of first recovered data; and
the application circuit receiving a plurality of pieces of first recovered data to perform a corresponding operation accordingly.

12. The method of claim 11, wherein if the first block has not been written, the plurality of pieces of first data in the first block have a first value.

13. The method of claim 12, wherein the data access system further comprises a comparison circuit, and the method further comprises:
the comparison circuit determining whether all pieces of first recovered data have the first value, so as to determine whether the first block has not been written.

14. The method of claim 11, wherein the application circuit is a double data rate (DDR) memory.

15. The method of claim 11, further comprising:
inverting a plurality of pieces of second data transmitted from the application circuit to generate a plurality of pieces of second inverted data.

16. The method of claim 15, further comprising the error checking and correcting circuit generating a plurality of pieces of error check code based on the plurality of pieces of second inverted data.

17. The method of claim 16, further comprising:
inverting the plurality of pieces of error check code to generate a plurality of pieces of inverted error check code.

18. The method of claim 17, further comprising:
inverting the plurality of pieces of second inverted data to generate a plurality of pieces of second recovered data; and
storing the plurality of pieces of second recovered data and the plurality of pieces of inverted error check code corresponding to the plurality of pieces of second recovered data in a second block of the flash memory.

* * * * *